(12) United States Patent
Lee et al.

(10) Patent No.: US 6,586,791 B1
(45) Date of Patent: Jul. 1, 2003

(54) TRANSISTOR INSULATOR LAYER INCORPORATING SUPERFINE CERAMIC PARTICLES

(75) Inventors: Tzu-Chen Lee, Woodbury, MN (US); Nelson B. O'Bryan, Woodbury, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 237 days.

(21) Appl. No.: 09/619,302

(22) Filed: Jul. 19, 2000

(51) Int. Cl.$^7$ .................. H01L 29/76; H01L 29/94; H01L 31/062; H01L 31/113; H01L 31/119

(52) U.S. Cl. .................. 257/295; 257/40; 257/310; 257/411; 257/412; 257/513

(58) Field of Search .................. 257/40, 295, 410, 257/310, 411, 513, 289

(56) References Cited

U.S. PATENT DOCUMENTS

| | | | |
|---|---|---|---|
| 3,660,328 A | | 5/1972 | Lindquist, Jr. |
| 4,537,865 A | | 8/1985 | Okabe et al. |
| 4,684,678 A | | 8/1987 | Schultz, et al. |
| 5,572,052 A | | 11/1996 | Kashihara et al. |
| 5,888,870 A | * | 3/1999 | Gardner et al. ............. 438/261 |
| 5,946,551 A | * | 8/1999 | Dimitrakopoulos et al. .. 438/99 |
| 5,981,970 A | * | 11/1999 | Dimitrakopoulos et al. .. 257/40 |
| 6,344,660 B1 | * | 2/2002 | Dimitrakopoulos et al. .. 257/40 |
| 6,344,662 B1 | * | 2/2002 | Dimitrakopoulos et al. .. 257/40 |
| 6,265,749 B1 | * | 7/2002 | Gardner et al. ............. 257/410 |
| 2002/0100947 A1 | * | 8/2002 | Lee et al. .................... 257/412 |

FOREIGN PATENT DOCUMENTS

| | | |
|---|---|---|
| EP | 0 327 355 | 8/1989 |
| WO | WO 92/18218 | 10/1992 |

OTHER PUBLICATIONS

Dimitrakopoulos C.D. et al., "Low–Voltage, High–Mobility Pentacene Transistors with Solution–Processed High Dielectric Constant Insulators" *Advanced Materials*, Nov. 10, 1999, vol. 11, No. 16, pp. 1372–1375.

Dimitrakopoulos C.D. et al., "Organic Transistors With Low Operating Voltage and High Mobility," *57th Annual Device Research Conference Digest*, pp. 116–119, Jun., 1999.

Gundlach, D.J., Kuo, C–C., Nelson, S. F., and Jackson, T.N., "Organic thin film transistors with field effect mobility >2 $cm^2/V-s$," *57th Annual Device Research Conference Digest*, pp. 164–165, Jun., 1999.

Dimitrakopoulos, C.D., Purushothaman, S., Kymissis, J., Callegari, A., Shaw, J.M., "Low–voltage organic transistors on plastic comprising high–dielectric constant gate insulators," *Science*, Feb. 5, 1999, vol. 283, pp. 822–824.

Bao, Z., Rogers, J.A., and Katz, H.E., "Printable organic polymeric semi–conducting materials and devices," *J. Mater. Chem.*, 1999, vol. 9, pp. 1895–1904.

Bao, Z., and Lovinger, A.J., "Soluble regioregular polythiophene derivatives as semiconducting materials for field–effect transistors," *Chem. Mater.*, 1999, vol. 11, pp. 2607–2612.

(List continued on next page.)

*Primary Examiner*—Eddie Lee
*Assistant Examiner*—Jesse A. Fenty
(74) *Attorney, Agent, or Firm*—Charles L. Dennis II

(57) ABSTRACT

An insulating layer in a field effect transistor is formed of superfine ceramic particles dispersed in a polymeric matrix. The characteristics of the insulating layer can be changed by varying the mix of ceramic particles and matrix components. Appropriate selection of components can provide a high dielectric constant material which is not subject to pinholes, has a high voltage breakdown and is chemically resistant. The material can be applied at relatively low processing temperatures, using a wide range of coating techniques, and is highly suited for use with polymeric substrates.

24 Claims, 2 Drawing Sheets

OTHER PUBLICATIONS

Bao, Z., "Materials and fabrication needs for low cost organic transistor circuits," Adv. Mater., 2000, vol. 12, No. 3, pp. 227–230.

Shaikh, A.S., Vest, R.W., and Vest, G.M., "Dielectric properties of ultrafine grained $BaTiO_3$," IEEE Transactions on Ultrasonics, Ferroelectrics and Frequency Control, Jul. 1989, vol. 16, No. 4, pp. 407–412.

Lee and Neville, *Handbook of Epoxy Resins*, McGraw–Hill Book Co., New York (1967).

May, C., ed., *Epoxy Resins, Chemistry and Technology*, Second Edition, Marcell Decker, Inc., New York (1988).

Bruins, P.F., ed., *Epoxy Resin Technology*, Interscience Publishers, New York, (1968).

\* cited by examiner

TRANSISTOR INSULATOR LAYER INCORPORATING SUPERFINE CERAMIC PARTICLES

BACKGROUND OF THE INVENTION

1. Technical Field

The present invention relates to high dielectric insulating layers for use in transistors, and in particular, organic layers.

2. Description of the Related Art

A typical field effect transistor ("FET") starts with a gate electrode applied to a substrate. An insulating layer then is applied on top of the gate electrode, sometimes overlapping onto the substrate. Source and drain electrodes then are applied on top of the insulating layer, spaced slightly apart with the gap between them positioned above the gate electrode. Finally, a layer of semiconductor is applied to fill the gap between the source and drain electrodes, often overlapping onto the top of the source and drain electrodes. The presence or absence of an appropriate voltage at the gate electrode then will drive the semiconductor into its conductive or non-conductive states, either electrically connecting or disconnecting the source and drain electrodes.

In an FET made with a semiconductor, some carriers (holes or electrons, depending on whether the semiconductor is a p-type or n-type semiconductor) in the semiconductor will be induced at the interface between the gate insulator and the semiconductor when a voltage is applied to the gate electrode. The carriers induced by this low gate bias voltage will first fill the trap levels, but may not be enough to completely fill those levels. Therefore, even at high drain voltages but at low gate bias voltages, one still cannot collect pronounced free carriers that can move freely from the source side to the drain side.

When the gate bias voltage is high enough (greater than a threshold voltage, $V_T$), more carriers will be induced. They can not only fill all the trap levels, but also have excessive carriers left, which can then be pushed to the conduction band of the semiconductor, where they are free to move. The potential difference between the drain and the source electrodes will then drive those free carriers to move from the source electrode to the drain electrode.

The current-voltage characteristics for a FET device are qualitatively modeled by the following equations:

Linear Region: $|V_{GS}-V_T 51 >|V_{DS}|$ (1)

$$I_D = \frac{Wc_i}{L}\mu(V_{GS} - V_T - V_{DS}/2)V_{DS}$$

Saturation Region: $|V_{GS}-V_T| \leq |V_{DS}|$ (2)

$$I_D = \frac{Wc_i}{2L}\mu(V_{GS} - V_T)^2$$

in which:

$c_i$ is the capacitance per unit area of the gate electrode= C/A;

$\mu$ is the field-effect mobility of the semiconductor;

$I_D$ is the current through the drain electrode;

L is the channel length between the source electrode and the drain electrode;

$V_{DS}$ is the voltage between the drain and source electrodes;

$V_{GS}$ is the voltage between the gate and source electrodes;

$V_T$ is the threshold voltage described above; and

W is the width of the channel, i.e., the width of the source and drain electrode pads.

The geometric parameters of the FET, such as the channel length and width, are defined by the mask pattern used to make the FET, and will certainly affect the device performance. As will be apparent from the equations, it is desirable to keep them as small as possible to achieve high current and high resolution (or high density). However, the size of the patterns usually is dictated mostly by the manufacturing process used to generate the patterns, with more sophisticated (and expensive) equipment needed to generate very small pattern sizes.

The equations highlight two other parameters which can potentially be adjusted as needed to achieve high currents at low operating voltages ($V_{DS}$ and $V_{GS}$), namely, generating a high capacitance and high field effect mobility to get a high current, $I_D$. High mobility usually is a function of the semiconductor used. High capacitance is dependent on the thickness of the insulating layer (the thinner, the better) and the dielectric constant of the insulating layer (the higher, the better). Therefore, one way to maximize the current $I_D$ at low voltages is to provide a thin insulating layer formed of a material with a high dielectric. At the same time, the insulating layer should be free of pinholes and have a high breakdown voltage to continue functioning as an insulator even when it is very thin. It also needs to be compatible with the subsequent processes needed to complete device and circuit fabrications, which means it should have a good chemical resistance.

Conventionally, all of the layers involved are inorganic materials. Most commonly, the substrate is crystalline silicon, the electrodes are metal, the insulating layer is silicon dioxide and the semiconductor is crystalline, polycrystalline or amorphous silicon. Well known alternatives use III–V semiconductors, such as gallium arsenide. All are characterized by high processing temperatures well in excess of 200° C.

Recently, there has been considerable interest in developing an organic field effect transistor ("OFET"). OFETs have the following potential advantages when compared with inorganic FETs:

(1) They can be produced using low cost processing methods, e.g., spin coating, web coating, inkjet printing and vacuum evaporation to form the active layers. It is even possible to do this on a moving web, rather than in batches on crystalline or glass wafers.

(2) They provide excellent compatibility with many different kinds of substrates (e.g., flexible plastic substrates, glass, metal foils, etc.), and can be made in very large sizes, i.e., they are not limited to the size to which crystals can be grown.

(3) The molecular structures and orientation for both the organic semiconductors and the substrates can be tailored with desired properties.

Due to these potential benefits, dramatic progress has been made in the development of OFETs, attracting increasing attention in both academic and industrial laboratories around the world. Gundlach, D. J., Kuo, C-C., Nelson, S. F., and Jackson, T. N., "Organic thin film transistors with field effect mobility >2 cm$^2$/V-s," 57*th Annual Device Research Conference Digest*, pp. 164–165, June, 1999, reported pentacene-based OFETs with a field effect mobility as large as 2.1 cm$^2$/V-s, which is higher than amorphous silicon. Dimitrakopoulos, C. D., Purushothaman, S., Kymissis, J., Callegari, A., Shaw, J. M., "Low-voltage organic transistors on plastic comprising high-dielectric constant gate insulators," Science, Feb. 5, 1999, Vol. 283, pp. 822–824, reported OFETs with a low operating voltage (<5 V) and a high mobility (~0.4 cm$^2$/V-s) by employing a high dielectric constant insulating film using barium zirconate titanate (BZT) and barium strontium titanate (BST) on a polycarbonate substrate.

OFETs are considered strong candidates for use in integrated circuits (ICs) in applications such as radio frequency identification (RFID) tags, digital displays, digital logic circuits and many other applications.

Unfortunately, one of the disadvantages to using OFETs is that the materials involved cannot withstand the high processing temperatures used with conventional inorganic materials. For example, the 200+° C. temperatures needed to process conventional inorganic materials would at the very least cause a polymeric substrate to deform, and might cause further breakdown of the polymer or even ignition at high enough temperatures. Deformation is highly undesirable, since each layer of the structure has to be carefully registered with the layers below it, which becomes difficult to impossible when the layers below it are deformed due to processing temperatures.

$SiO_2$, $SiN_x$, $AlO_x$, and $TaO_x$ are the most popular dielectric materials employed in both inorganic and organic semiconductor FETs. However, the conventional methods for depositing these materials, such as chemical vapor deposition (CVD) and plasma enhanced CVD, need high temperatures (>300° C.) which are not compatible with polymeric substrates. Without such high processing temperatures, poor film quality and pinholes are typically unavoidable, resulting in poor insulating properties. Another widely used process is ion beam deposition, but it needs high vacuum and expensive equipment which are incompatible with the goal of very low cost production. Similarly, use of BZT and BST need either a high firing temperature (400° C.) for the sol-gel process, or radio-frequency magnetron sputtering, which also requires vacuum equipment, and may also have stoichiometric problems.

In addition, the dielectric constants for these materials other than $TaO_x$ are not high enough to achieve the low operating voltage and high current which are desirable features for display drivers and other likely applications for OFETs. Likewise, the organic films which have been considered, such as polyimide, polyester, and epoxy, do not have the desired high dielectric constants, and thus need undesirable high voltages to operate OFETs. Bao, Z., Rogers, J. A., and Katz, H. E., "Printable organic polymeric semiconducting materials and devices", J. Mater. Chem., 1999, Vol. 9, pp. 1895–1904; Bao, Z., and Lovinger, A. J., "Soluble regioregular polythiophene derivatives as semiconducting materials for field-effect transistors", Chem. Mater., 1999, Vol. 11, pp. 2607–2612; Bao, Z., "Materials and fabrication needs for low cost organic transistor circuits", Adv. Mater., 2000, Vol. 12, No. 3, pp. 227–230.

The insulating layers in some discrete and integrated circuit capacitors are formed using a polymeric matrix loaded with ceramic particles to increase the dielectric constant of the polymer alone. The ceramic particles used in such materials typically range in average diameter from 500 to 3000 nm, the insulating layer is over 10,000 nm thick and the polymer matrix typically is loaded with at least 50% ceramic particles, and usually much more. See, e.g., U.S. Pat. No. 3,660,328 (Lindquist) and WO 92/18218 (Du Pont).

Such systems would not work in the insulating layer of a typical transistor because the ceramic grains are simply too large to fit. In contrast to the 10,000+ nm thickness of the insulating layer in a capacitor, the insulating layer in a transistor normally is no more than 500 nm. This means that the grain sizes can be no more than about 200 nm to be able to coat the layer.

Unfortunately, there is a reason particles between 500 and 3000 nm are used in capacitors—that particle size is the range in which the dielectric constant of the particles peaks. As shown in FIG. 2 of Shaikh, A. S., Vest, R. W., and Vest, G. M., "Dielectric properties of ultrafine grained $BaTiO_3$", EEE Transactions on Ultrasonics, Ferroelectrics and Frequency Control, July 1989, Vol. 16, No. 4, pp. 407–412, the dielectric constant of ceramic particles plummets as the grain size moves below about 500 nm, so simply substituting smaller grains would not normally be expected to work.

SUMMARY OF THE INVENTION

According to the present invention, a material is provided for use as an insulating layer, which is formed of superfine ceramic particles dispersed in a polymeric matrix. The characteristics of the material can be varied by varying the selection and relative concentrations of the ceramic particles and matrix components. Appropriate selection can provide high dielectric constant materials that are not subject to pinholes, have a high voltage breakdown and are chemically resistant.

The ceramic particles should be less than ~200 nm, preferably less than ~100 nm, and probably about ~50 nm in average diameter. The particles can be formed from a variety of materials. Each particle can be formed from a single one or a combination of these materials. The particles included in the layer can all be uniform, or can vary in material composition and/or size.

The polymeric matrix can be a polymer, such as an epoxy resin, formed from a variety of monomeric materials.

The characteristics of the insulating layer can be adjusted by appropriate selection and combination of materials. The minimum coating thickness can be varied by adjusting the particle size and percent solids in the polymeric matrix, while the dielectric constant can be varied by adjusting the ratio and selection of ceramic particles to the matrix material.

The insulating layer of the present invention can be applied using a wide variety of techniques, such as spin-coating, slide or bar coating, gravure printing, and inkjet printing. Some of these application techniques will allow patterning of the coating, so that circuits can be laid down easily and continuously. Generally speaking, these materials are not sensitive to air exposure during the manufacturing process, so the entire process can be carried out in a normal environment, without the need for expensive vacuum equipment.

As will be apparent, the combination of the inorganic ceramic particles into the organic matrix combines the best of both types of materials, namely, the high dielectric properties of the ceramic particles are combined with the flexible application capabilities of the organic matrix. In addition, due to the wide range of potential combinations of materials, the characteristics of the layer can be varied easily by adjusting the materials in the mix.

BRIEF DESCRIPTION OF THE DRAWINGS

The invention will be described in further detail with reference to the drawings, in which.

DETAILED DESCRIPTION OF THE PREFERRED EMBODIMENTS

Figure 1:
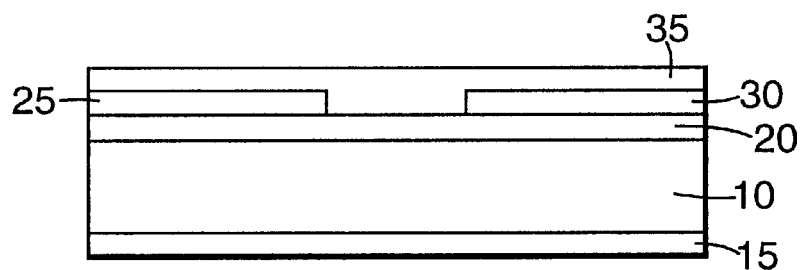
FIG. 1 is a schematic cross-sectional representation of a transistor produced according to the present invention.

According to the present invention, an insulating layer for a field effect transistor is formed of superfine ceramic particles dispersed in a polymeric matrix.

The ceramic particles should be less than ~200 nm in average diameter, since that is typically the maximum desired thickness for the insulating layer. Preferably, the particles are less than ~100 nm to provide for easy dispersion within the polymeric matrix, and more preferably, about ~50 nm in average size. The particles can be formed from any suitable material which can be formed into particles having a high dielectric, including, for example, high dielectric constant ferroelectric ceramic material including, but not limited to, lead zirconate, barium zirconate, cadmium niobate, barium titanate, and titanates and tantalates of strontium, lead, calcium, magnesium, zinc and neodymium, and solid solutions thereof. By the term ceramic "solid solution" is meant a ceramic system of two or more components in which the ceramic components are miscible in each other. In addition, ceramic materials useful in the invention include barium zirconium titanate (BZT), barium strontium titanate (BST), barium neodymium titanate, lead magnesium niobate, and lead zinc niobate. Each particle can be formed from a single one or a combination of these materials. The particles included in the layer can all be uniform, or can vary in material composition and/or size. In addition, ceramic materials useful in the invention may be modified by additives including, but not limited to, oxides of zirconium, bismuth, and niobium. Preferably, the ceramic particles comprise barium titanate.

The polymeric matrix or binder should be one that will serve as an adequate carrier for the ceramic particles. It should be coatable at the desired thickness using the desired coating technique, preferably without forming pinholes, or, if pinholes do form, treatable to substantially eliminate the pinholes at a temperature low enough to avoid causing problems (such as deforming, denaturing or ignition) for the other components in the transistor. Preferably, suitable binders are polymers that exhibit low dielectric losses and that can accept a high loading of ceramic particles without sacrificing mechanical integrity or the ability to adhere to a substrate. In addition, it is preferred that mechanical and chemical processing steps necessary to production of the transistors of the invention are not harmful to the binder.

For example, polymeric binders useful in the invention can be formed from epoxies, polyimides, polyamides, polyetherimides, polyamide-imides, fluoropolymers, polyacrylates, polyetherketones, polyetheretherketones, polysulfones, polyphenylene sulfides, bismaleimide resins, phenolic resins, polyesters, polyethylenes, polybutadienes, and/or cyanate esters, alone or in combination with each other. Preferred polymeric binders include epoxy resins.

The epoxy resin component may be comprised of epoxy monomers, epoxy oligomers having epoxy functions available for bonding, epoxy polymers having epoxy functions available for bonding, or any combinations thereof. The epoxy resin component of the invention preferably comprises compounds which contain one or more 1,2-, 1,3- and 1,4-cyclic ethers, which also may be known as 1,2-, 1,3- and 1,4-epoxides. The 1,2-cyclic ethers are preferred. Such compounds can be saturated or unsaturated, aliphatic, alicyclic, aromatic or heterocyclic, or can comprise combinations thereof. Compounds that contain more than one epoxy group (i.e., polyepoxides) are preferred.

Aromatic polyepoxides (i.e., compounds containing at least one aromatic ring structure, e.g., a benzene ring, and more than one epoxy group) that can be used in the present invention include the polyglycidyl ethers of polyhydric phenols, such as Bisphenol A-type resins and their derivatives, epoxy cresol-novolac resins, Bisphenol-F resins and their derivatives, and epoxy phenol-novolac resins; and glycidyl esters of aromatic carboxylic acids, e.g., phthalic acid diglycidyl ester, isophthalic acid diglycidyl ester, trimellitic acid triglycidyl ester, and pyromellitic acid tetraglycidyl ester, and mixtures thereof. Preferred aromatic polyepoxides are the polyglycidyl ethers of polyhydric phenols, such as the EPON™ series of diglycidyl ethers of Bisphenol-A, including EPON 828, EPON 1050 and EPON 1001F, available commercially from Shell Chemicals, Inc., Houston, Tex.

Representative aliphatic cyclic polyepoxides (i.e., cyclic compounds containing one or more saturated carbocyclic rings and more than one epoxy group, also known as alicyclic compounds) useful in the present invention include the "ERL™" series of alicyclic epoxides commercially available from Union Carbide Corp., Danbury, Conn., such as vinyl cyclohexene dioxide (ERL-4206), 3,4-epoxycyclohexylmethyl-3',4'-epoxycyclohexane carboxylate (ERL-4221), 3,4-epoxy-6-methylcyclohexylmethyl-3', 4'-epoxy-6-methylcyclohexane carboxylate (ERL-4201), bis (3,4-epoxy-6-methylcylohexylmethyl)adipate (ERL-4289), dipentene dioxide (ERL-4269), as well as 2-(3,4-epoxycyclohexyl-5,1"-spiro-3",4"-epoxycyclohexane-1,3-dioxane, 4-(1,2-epoxyethyl)-1,2-epoxycyclohexane and 2,2-bis(3,4-epoxycyclohexyl)propane. Preferred alicyclic polyepoxides are the ERL™ series.

Representative aliphatic polyepoxides (i.e., compounds containing no carbocyclic rings and more than one epoxy group) include 1,4-bis(2,3-epoxypropoxy)butane, polyglycidyl ethers of aliphatic polyols such as glycerol, polypropylene glycol, 1,4-butanediol, and the like, and the diglycidyl ester of linoleic dimer acid.

A wide variety of commercial epoxy resins are available and are listed or described in, e.g., the *Handbook of Epoxy Resins*, by Lee and Neville, McGraw-Hill Book Co., New York (1967), *Epoxy Resins*, Chemistry and Technology, Second Edition, C. May, ed., Marcell Decker, Inc., New York (1988), and *Epoxy Resin Technology*, P. F. Bruins, ed., Interscience Publishers, New York, (1968). Any of the epoxy resins described therein may be useful in preparation of the materials of the present invention.

Certain thermally-activated curing agents for epoxy resins (e.g., compounds that effect curing and crosslinking of the epoxide by entering into a chemical reaction therewith) can be useful in the present invention. Preferably, such curing agents are thermally stable at temperatures at which mixing of the components takes place.

Suitable thermal curing agents include aliphatic and aromatic primary and secondary amines, e.g., di(4-aminophenyl)sulfone, di(4-aminophenyl)ether, and 2,2-bis-(4-aminophenyl)propane; aliphatic and aromatic tertiary amines, e.g., dimethylaminopropylamine, 2,4,6-tris (dimethylaminomethyl)phenol, and pyridine; quaternary ammonium salts, particularly pyridinium salts such as N-methyl-4-picolinium hexafluorophosphate; sulfoninum salts; fluorene diamines, such as 9,9-bis(3-methyl-4-aminophenyl)fluorene (OTBAF) and 9,9-bis(3-chloro-4- aminophenyl)fluorene (CAF), as well as those described in U.S. Pat. No. 4,684,678, incorporated herein by reference; boron trifluoride complexes such as $BF_3 \cdot Et_2O$ and $BF_3 \cdot H_2NC_2H_5OH$; imidazoles, such as methylimidiazole; hydrazines, such as adipohydrazine; and guanidines, such as tetramethylguanidine and dicyandiamide (cyanoguanimide, commonly known as DiCy).

Catalysts useful in the invention can be present in an amount in the range of 0.01 to 10 weight percent, based on total epoxy resin composition, preferably 0.01 to 5 weight percent, and most preferably 0.5 to 3 weight percent. Catalysts may be added to the chosen epoxy in a powder form at temperatures up to about 150° C. Incorporation time can range from 10–20 minutes depending on the epoxy/catalyst system.

It is preferable to crosslink the polymer binder to achieve adhesion, chemical resistance and mechanical robustness. In some cases the crossslinking and/or curing reaction may be inhibited by the alkaline nature of the ceramic filler, such that the choice of reagent may depend on both the binder and the filler. Crosslinking can be achieved by ring opening and by chemical addition, as exemplified by the use of bis (aminofluorene) or anhydride crosslinking agents. Alternatively, crosslinking can be achieved catalytically, as exemplified by the use of tertiary amine crosslinking agents. Crosslinking of epoxies can take place by either thermal or photochemical reactions. Preferably, thermal crosslinking is used at temperatures below 200° C., preferably below 150° C., and more preferably below 100° C.

The characteristics of the insulating layer can be adjusted by appropriate selection and combination of materials. Coating thickness can be varied by adjusting the percent solids in the matrix material through addition of solvents, while the dielectric constant can be varied by adjusting the ratio and selection of ceramic particles to matrix material, e.g., changing the ceramic or combination of ceramics used in the matrix, the size of the particles and the like. The combined dielectric effects of the polymeric matrix and the ceramic particles adjusted be set to provide sufficient insulating properties to function at the intended operating conditions of the transistor, typically meaning a total dielectric constant of at least about 4, preferably about 10 and more preferably about 15.

The insulating layer according to the present invention can be applied using a wide variety of techniques, such as spin-coating, slide-coating, gravure printing, and inkjet printing. Some of these application techniques will allow patterning of the coating, so that circuits can be laid down easily, and continuously. Generally speaking, these materials are not sensitive to air exposure during the manufacturing process, so the entire process can be carried out in a normal environment, without expensive vacuum equipment. In addition, many of these processes can be implemented at temperatures providing clear applicability to production of OFETs.

Transistors of the invention can be prepared using any of a number of semiconductor materials, including, but not limited to, polysilicon and amorphous silicon, and organic semiconductors such as pentacene, copper phthalocyanine (CuPc), trans-polyacetylene, polydiacetylene, poly(p-phenylene), poly(p-phenylenevinylene), poly(2,5-dialkoxy-p-phenylenevinylenes), polythiophene, poly(3-alkylthiophenes), poly(2,5-thiophenevinylene), polypyrrole, polyaniline, and the like, as well as mixtures and combinations thereof.

The invention will be further described with reference to the following specific examples.

EXAMPLE 1

The device shown in representative cross section in FIG. 1 was prepared as follows:

A barium titanate ($BaTiO_3$)/epoxy dispersion was prepared by obtaining $BaTiO_3$ from TPL, Inc. (Albuquerque, N.Mex.) in powder form. The particles in the power averaged ~50 nm in size. The powder was mixed with a solution of epoxy resin (Epon™ 1001F and Epon™ 1050 in an 8:2 ratio, Shell Chemical Co., Houston, Tex.) in a 2:3 mixture, by volume, of methyl ethyl ketone:methyl isobutyl ketone. This solution also contained a polyamine/polyester dispersant (PS3™, Uniqema, Wilmington, Del.) to stabilize the resulting dispersion. The initial dispersion was done with a high shear rotor/stator mixer. Final processing was with a microfluidizer. The volume ratio of $BaTiO_3$ to epoxy was approximately 1:1. Once the dispersion was prepared, it was diluted with additional solvent to give a solids loading of 31%. A catalyst, 2,4,6-tris(dimethylaminomethyl)phenol (Aldrich Chemical Co., Wilmington, Del.), was added to crosslink the epoxy. The amount of catalyst was 1% based on the weight of epoxy. The activated dispersion had very low viscosity and could be easily coated by a variety of methods.

A heavily doped 10 cm-diameter silicon wafer 10 with one side deposited with 5,000 Å of aluminum 15 (to serve as the gate electrode) was used as a substrate. The exposed silicon side was first dipped in a buffered HF solution to remove any residual $SiO_2$ film that might have been formed. The dispersion prepared above was spin-coated onto the wafer at a spin speed of 8,000 rpm, then baked at 150° C. for about 150 minutes to produce an insulating layer 20 with a thickness of about 0.6 microns.

After coating, the surface formed striation-like patterns originating from the center of the spinning. The peak-to-valley height was approximately 0.3 μm. However, this striation pattern seemed not to affect the results of the subsequent resist patterning and metal contact formation. The dried film was also chemically resistant to organic solvents such as acetone and methanol, negative photoresist containing cyclohexanone, and the resist developer (containing tetramethyl ammonium hydroxide and water).

A thin layer of negative photoresist NR7-1000PY™ (Futurrex, Inc., Franklin, N.J.) then was spin coated on a sample of coated substrate approximately 2 cm×2 cm in size at a spin speed of 4,000 rpm. A source and drain photo mask were used to form the source and drain electrode pattern. After UV exposure and development, the resist in areas where the source and drain pads (1 mm×0.12 mm) were formed was washed off and thus the underlying $BaTiO_3$-epoxy surface was exposed. The remaining areas, however, were still protected by the resist.

Next, a multi-film stack of 30 Å germanium/100 Å titanium/600 Å gold was deposited on the sample in a vacuum chamber. The lift-off technique was then used to form the source and drain pads 25, 30, i.e., the remaining resist was dissolved in an ultrasonically agitated acetone bath, so that the multi-film stack of the metal film residing on top of the resist was dissolved off as well.

Finally, a 500 Å thick coating of pentacene (Aldrich Chemical Co.) was vacuum deposited on the patterned sample as an organic semiconductor layer 35. The sample was held at 70° C. during the deposition.

The dielectric constant of the thus prepared insulating layer was measured by measuring capacitance after the source and drain electrodes are patterned, using the following relationship:

$$C = \epsilon \epsilon_0 A/d,$$

where

C is the capacitance to be measured, $\epsilon$ is the dielectric constant of the insulator, $\epsilon_0$ is the permittivity of free space (=8.854×10$^{-14}$ F/cm), A is the area of the source or drain pad=1.2×10$^{-3}$ cm$^2$, defined by the current mask pattern, and d is the thickness of the gate insulator.

The average value of the dielectric constant through multiple measurements over the sample was about 16.4, which is much higher than that the averages for SiO$_2$ (3.9), SiN$_x$ (7.2–7.6), or AlO$_x$ (7.6–8.9).

The breakdown voltage was measured from a curve tracer on a probe station used to examine the OFET performance by gradually increasing the voltage applied to the capacitor until burn-outs or bubbles appear on the electrode pads. The sample prepared above showed that a breakdown voltage between 50–60 volts.

A Hewlett Packard 4145A Semiconductor Parameter Analyzer (Hewlett Packard Instruments, Palo Alto, Calif.) equipped with a custom written software for controlling the system was used to measure the OFET's performance. The sample was placed on a probe station with three probes in contact with the gate, source, and drain electrodes, respectively. The source electrode was grounded and the gate and drain electrodes were negatively biased with respect to the ground, but were independently biased. Negative bias voltages were used for the gate because the organic semiconductor, pentacene, is a p-type material.

Figure 2:
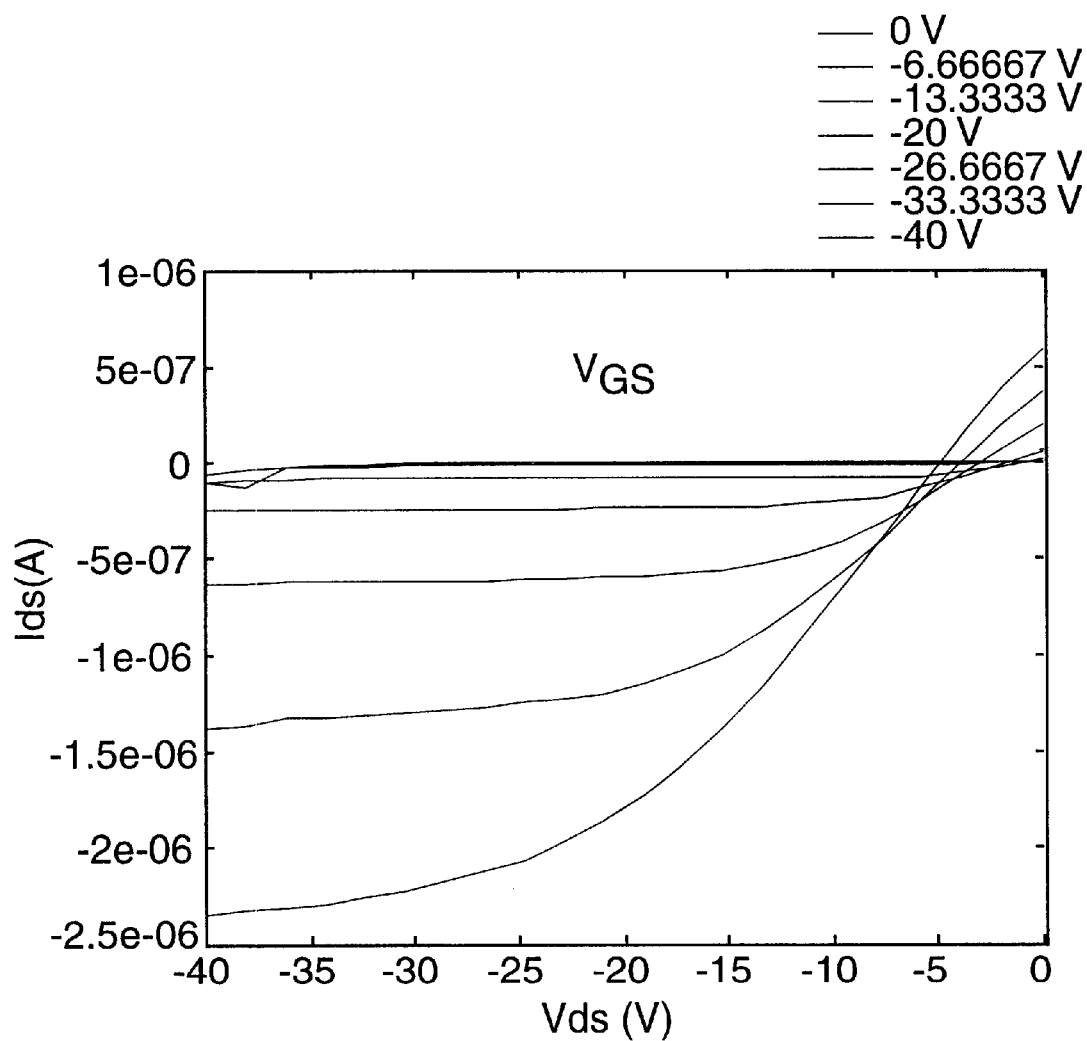
FIGS. 2–4 are graphs of the current versus voltage for transistors produced according to first, second and third examples of the present invention, respectively.

FIG. 2 is a plot of the drain to source current ($I_{DS}$) versus voltage ($V_{DS}$) characteristics of the resulting transistor. As can be seen, the sample provides current modulation over a broad range of voltages.

EXAMPLE 2

Figure 3:
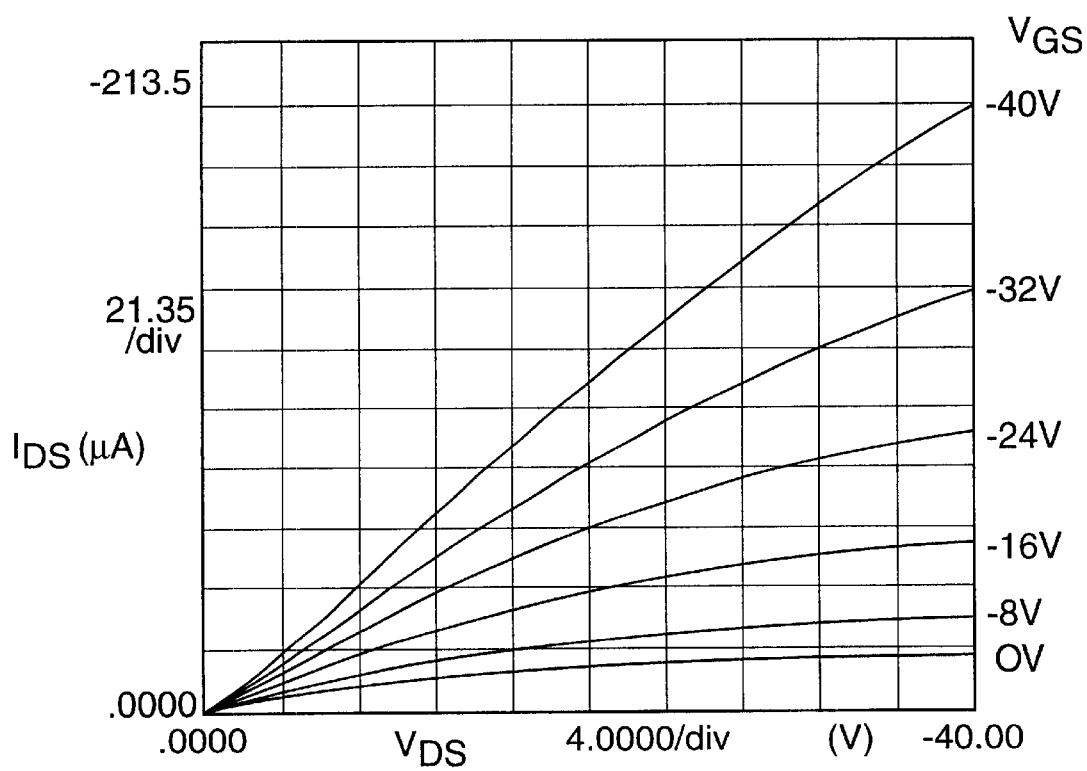

A second sample was prepared using essentially the same materials and processes as in Example 1, except for the process of coating the insulating layer. Instead of spin-coating, the insulating layer was coated with a No. 2.5 Meyer bar, to produce an insulator layer approximately 1.5±0.8 μm thick. The current versus voltage characteristics are shown in FIG. 3.

EXAMPLE 3

A process similar to that described for Example 1 was used to create a third example, with the following variations:

Pigment: lead magnesium niobate (PbMgNbO$_3$)

Pigment size: 0.3 micron mean

Percent solids in dispersion: 40%

Volume loading of pigment in epoxy (for dried coatings): 45%

Cure temperature: 170 to 180° C. for 1.5 hours

Crosslinking agent: 1:1 mixture (by weight) of 9,9-bis(3-methyl-4-aminophenyl)fluorene (OTBAF) and 9,9-bis(3-chloro-4-aminophenyl)fluorene (CAF) comprising 20% by weight of the total weight of the binder composition, prepared as described in U.S. Pat. No. 4,684,678, Example 2, as follows:

The following ingredients were placed into a 500 ml pressure vessel:

18.0 g fluorenone 107.0 g 2-methylaniline 5.6 g methanesulfonic acid

The vessel was sealed and heated to 175° C. for 24 hours. The water formed in the condensation reaction was retained in the vessel throughout the reaction. The vessel was cooled and its contents poured into 1 liter of methanol containing twenty grams of triethyl amine.

The white crystalline product was filtered and washed with methanol until the effluent was colorless.

Figure 4:
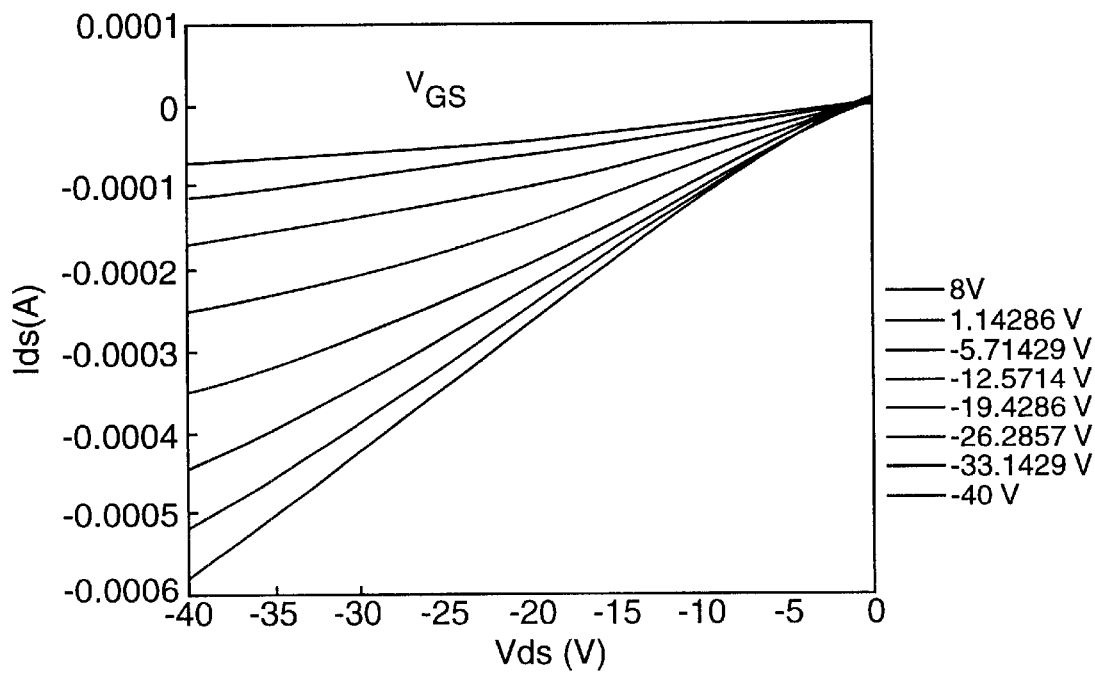

The current versus voltage characteristics of the resulting transistor are shown in FIG. 4.

As can be seen from the foregoing examples, a wide range of materials and coating techniques can be used to produce the insulating layer according to the present invention. While the examples were created on silicon wafers for convenience, it will be understood that they also could be created on other substrates, including polymeric and other flexible substrates. Further, while the transistors shown and described in the examples have the gate electrode on one side of the substrate and the source and drain electrodes spaced several layers from the substrate on the opposite side of the substrate, these electrodes could be placed on the same side of the substrate, as well as in an inverted configuration, all as is well known to one of skill in the art. In addition, conditions in the examples may still need optimization. For example, the subsequent testing has indicated that baking for just 12 minutes at 150° C. may be sufficient to allow the insulating layer to withstand acetone, rather than the 150 minutes used in Example 1.

It therefore will be understood that these exemplary embodiments in no way limit the scope of the invention. Other modifications of the invention will be apparent to those skilled in the art in view of the foregoing description. These descriptions are intended to provide specific examples of embodiments which clearly disclose the present invention. Accordingly, the invention is not limited to the described embodiments or to the use of specific elements, dimensions, materials or configurations contained therein. All alternative modifications and variations of the present invention which fall within the spirit and scope of the appended claims are covered.

We claim:

1. A transistor comprising:

a) A gate electrode;

b) An insulating layer proximate the gate electrode, the insulating layer comprising:

i) A polymeric matrix; and ii) Ceramic particles less than about 200 nm in average diameter dispersed in the matrix;

c) A source electrode and a drain electrode proximate the insulating layer on an opposite side thereof from the gate electrode and spaced from each other; and d) A semiconductor layer connecting the source and drain electrodes, the gate electrode being positioned such that a voltage in the gate electrode will cause the semiconductor to electrically connect the source and drain electrodes.

2. The transistor of claim 1, further comprising a substrate, and wherein the gate electrode is deposited on the substrate.

3. The transistor of claim 1, further comprising a substrate, and wherein the source and drain electrodes are deposited on the substrate.

4. The transistor of claim 1, wherein the polymeric matrix and the ceramic particles have combined dielectric effects providing sufficient insulating properties to function at the intended operating conditions of the transistor.

5. The transistor of claim 4, wherein the insulating layer has a dielectric constant greater than about 4.

6. The transistor of claim 5, wherein the insulating layer has a dielectric constant greater than about 10.

7. The transistor of claim 6, wherein the insulating layer has a dielectric constant greater than about 15.

8. The transistor of claim 1, wherein the polymeric matrix is curable at temperatures less than about 200° C.

9. The transistor of claim 8, wherein the polymeric matrix is curable at temperatures less than about 150° C.

10. The transistor of claim 9, wherein the polymeric matrix is curable at temperatures less than about 100° C.

11. The transistor of claim 1, wherein the polymer of the matrix is formed of at least one material selected from the group consisting of polyimides, polyamides, polyetherimides, polyamide-imides, fluoropolymers, polyacrylates, polyetherketones, polyetheretherketones, polysulfones, polyphenylene sulfides, bismaleimide resins, phenolic resins, polyesters, polyethylenes, polybutadienes, and cyanate esters.

12. The transistor of claim 1, wherein the polymeric matrix is an epoxy, the epoxy resin of which is formed from at least one material selected from the group consisting of the polyglycidyl ethers of polyhydric phenols, Bisphenol A-type resins and their derivatives, epoxy cresol-novolac resins, Bisphenol-F resins and their derivatives, epoxy phenol-novolac resins, glycidyl esters of aromatic carboxylic acids, phthalic acid diglycidyl ester, isophthalic acid diglycidyl ester, trimellitic acid triglycidyl ester, and pyromellitic acid tetraglycidyl ester, diglycidyl ethers of Bisphenol-A, 2-(3,4-epoxycyclohexyl-5,1"-spiro-3",4"-epoxycyclohexane-1,3-dioxane, 4-(1,2-epoxyethyl)-1,2-epoxycyclohexane and 2,2-bis(3,4-epoxycyclohexyl) propane, 1,4-bis(2,3-epoxypropoxy)butane, polyglycidyl ethers of aliphatic polyols, glycerol, polypropylene glycol, 1,4-butanediol and the diglycidyl ester of linoleic dimer acid.

13. The transistor of claim 1, wherein the polymeric matrix is an epoxy resin, the curing agent of which is formed from at least one material selected from the group consisting of di(4-aminophenyl)sulfone, di(4-aminophenyl)ether, 2,2-bis-(4-aminophenyl)propane, dimethylaminopropylamine, 2,4,6-tris(dimethylaminomethyl)phenol, pyridine, pyridinium salts, N-methyl-4-picolinium hexafluorophosphate, 9,9-bis(3-methyl-4-aminophenyl)fluorene (OTBAF), 9,9-bis(3-chloro-4-aminophenyl)fluorene (CAF), boron trifluoride complexes, $BF_3 \cdot Et_2O$, $BF_3 \cdot H_2NC_2H_5OH$, imidazoles, methylimidiazole, hydrazines, adipohydrazine, guanidines and tetramethylguanidine dicyandiamide.

14. The transistor of claim 1, wherein the ceramic particles are formed of at least one material selected from the group consisting of ferroelectric ceramic materials.

15. The transistor of claim 14, wherein the ceramic particles are formed of at least one material selected from the group consisting of lead zirconate, barium zirconate, cadmium niobate, barium titanate, titanates and tantalates of strontium, lead, calcium, magnesium, zinc and neodymium, and solid solutions thereof, barium zirconium titanate, barium strontium titanate, barium neodymium titanate, lead magnesium niobate and lead zinc niobate.

16. The transistor of claim 14, wherein a given ceramic particle is formed of only one material.

17. The transistor of claim 16, wherein different ceramic particles are formed of different materials.

18. The transistor of claim 1, wherein the ceramic particles are less than about 100 nm in average diameter.

19. The transistor of claim 18, wherein the ceramic particles are less than about 50 nm in average diameter.

20. The transistor of claim 1, wherein the semiconducting layer is formed of at least one material selected from the group consisting of polysilicon, amorphous silicon, pentacene, copper phthalocyanine, trans-polyacetylene, polydiacetylene, poly(p-phenylene), poly(p-phenylenevinylene), poly(2,5-dialkoxy-p-phenylenevinylenes), polythiophene, poly(3-alkylthiophenes), poly(2,5-thiophenevinylene), polypyrrole, and polyaniline.

21. An integrated circuit comprising multiple operationally connected copies of the transistor of claim 1.

22. A transistor comprising:
 a) A metallic gate electrode;
 b) An insulating layer proximate the gate electrode, the insulating layer comprising:
  i) A polymeric matrix comprising a cured epoxy resin; and
  ii) Barium titanate particles about 50 nm in average diameter dispersed in the matrix;
 c) A metallic source electrode and a metallic drain electrode proximate the insulating layer on an opposite side thereof from the gate electrode and spaced from each other; and
 d) A semiconductor layer comprising pentacene connecting the source and drain electrodes, the gate electrode being positioned such that a voltage in the gate electrode will cause the semiconductor to electrically connect the source and drain electrodes.

23. The transistor of claim 22, wherein the epoxy comprises diglycidyl ethers of Bisphenol-A catalyzed by 2,4,6-tris(dimethylaminomethyl)phenol.

24. The transistor of claim 22, wherein the volume ratio of polymeric matrix to barium titanate particles in the insulating layer is about 1:1.

* * * * *

UNITED STATES PATENT AND TRADEMARK OFFICE
CERTIFICATE OF CORRECTION

PATENT NO.    : 6,586,791 B1
DATED         : July 1, 2003
INVENTOR(S)   : Lee, Tzu-Chen It is certified that error appears in the above-identified patent and that said Letters Patent is hereby corrected as shown below:

Column 1,
Line 47, delete "$|V_{GS} - V_T 51|$" and insert -- $|V_{GS} - V_T|$ -- therefor.

Column 4,
Line 11, delete "EEE" and insert -- IEEE -- therefor.

Column 6,
Line 16, delete "EPONTM" and insert -- EPON $^{TM}$ -- therefor.
Line 46, please italicize "Chemistry and Technology".

Column 9,
Line 22, delete "b om-outs" and insert -- burn-outs -- therefor.

Signed and Sealed this

Eighteenth Day of October, 2005

JON W. DUDAS
*Director of the United States Patent and Trademark Office*